United States Patent [19]
Lee et al.

[11] Patent Number: 5,496,779
[45] Date of Patent: Mar. 5, 1996

[54] METHOD FOR FABRICATING A SELF-ALIGNED T-GATE METAL SEMICONDUCTOR FIELD EFFECT TRANSISTOR

[75] Inventors: Kyung-Ho Lee; Youn-Kyu Bae; Kwang-Eui Pyun; Kyung-Soo Kim, all of Daejeon, Rep. of Korea

[73] Assignee: Electronics and Telecommunications Research Institute, Daejeon-Shi, Rep. of Korea

[21] Appl. No.: 358,886

[22] Filed: Dec. 19, 1994

[30] Foreign Application Priority Data

Nov. 15, 1994 [KR] Rep. of Korea ............... 94-29931

[51] Int. Cl.⁶ .................................. H01L 21/265
[52] U.S. Cl. .................. 437/40; 437/41; 437/42; 437/44; 437/944
[58] Field of Search .................. 437/40, 41, 42, 437/44, 944, 203, 41 SH, 40 SH; 257/280, 281, 282, 283, 284, 618, 622

[56] References Cited

U.S. PATENT DOCUMENTS

| | | | |
|---|---|---|---|
| 4,959,326 | 9/1990 | Roman et al. | 257/284 |
| 5,053,348 | 10/1991 | Mishra et al. | 437/41 |
| 5,182,218 | 1/1993 | Fujihira | 437/41 |
| 5,288,654 | 2/1994 | Kasai et al. | 437/41 |
| 5,300,445 | 4/1994 | Oku | 437/41 |
| 5,334,542 | 8/1994 | Saito et al. | 437/41 |
| 5,369,044 | 11/1994 | Shimura | 437/944 |

Primary Examiner—Brian E. Hearn
Assistant Examiner—Kevin M. Pilardat
Attorney, Agent, or Firm—Larson and Taylor

[57] ABSTRACT

Disclosed is a method of fabricating a metal semiconductor field effect transistor, comprising the steps for, forming the channel using an ion-implantation, sequentially forming a first insulator layer at a first predetermined temperature and a second insulation layer at second predetermined temperature over the surface of the substrate, etching the first and second insulation layers using a gate pattern of a photo-resist pattern to expose the channel region as a mask, forming a refractory metal over the surface of the first and second insulation layer add the exposed channel region, etching the refractory metal, thereby dividing it into two parts of which one is formed on the channel region and the other is formed on the second insulation layer, selectively etching the first and second insulation layers to lift-off the refractory metal over the first and second insulation layers, thereby forming a gate of a T-shape on the channel region, ion implanting Si into a substrate using the gate and a channel pattern of a photo-resist film to form a self-aligned high concentration ion implantation region, forming a third insulation layer for preventing As of evaporation, carrying out a rapid thermal annealing for activation, removing the third insulation layer; and forming an ohmic electrode using a lift-off process.

5 Claims, 4 Drawing Sheets

5,496,779

METHOD FOR FABRICATING A SELF-ALIGNED T-GATE METAL SEMICONDUCTOR FIELD EFFECT TRANSISTOR

BACKGROUND OF THE INVENTION

The present invention relates to a method for fabricating a metal semiconductor field effect transistor, and more particularly to a method for fabricating a GaAs metal semiconductor field effect transistor capable of reducing a resistance of a conduction channel according to a current flow and making a high-integration easier.

The prior method for a self-aligned gate (SAG) is as follows. First, a refractory metal is deposited over a substrate and a photo-resist film is coated over the refractory metal and then is subjected to a development process to pattern a gate portion. The refractory metal is over etched so as to form a self-aligned T-gate having a size smaller than a photoresist pattern using a dry etching method under a condition that the photo-resist pattern is used as a mask.

According to the prior method, on overetching the metal deposited on the substrate, it is apt to damage the substrate due to a dry etching method. And after patterning a gate, because the metal for a gate is remaining on the gate portion of the substrate, the prior method has a shortage in that it is not able to carry out a recess etching process for controlling a current of a device.

In order to solve the shortage, a self-aligned implantation for $N^+$ layer technology SAINT has been proposed. (SAINT) for solving said shortage of SAG, comprises processes of alternately depositing and coating a silicon nitride film, a first-photo-resist film, a silicon dioxide film and a second photo-resist film, thereby forming multi-layers, patterning the second photo-resist film to form a gate pattern, etching the silicon dioxide film and the first photo-resist film using the gate pattern of the second photo-resist film as a mask, ion implanting an n-type impurity using the gate pattern of the second photo-resist film as a mask, depositing a silicon dioxide film, selectively wet-etching the silicon dioxide film, carrying out a lift-off process to expose the silicon nitride film of the gate portion, annealing for activation and forming an ohmic electrode and a gate electrode.

On exposing the gate portion, SAINT carries out a recess etching process. Since a gate is formed after annealing it is possible to select a gate metal and then deposit it. However, it has a disadvantage that the fabrication process is very complicate.

SUMMARY OF THE INVENTION

Accordingly, it is an object of the present invention provide a method for fabricating a GaAs metal semiconductor field effect transistor which is capable of reducing a resistance of a conduction channel according to a current flow, thereby improving electrical performance of the device and making the high-integration easier.

These objects and other features can be achieved by providing a method for fabricating a metal semiconductor field effect transistor, comprising the steps of: defining an N channel over a GaAS substrate with a photo-resist film and ion implanting Si to form the channel using the photo-resist film; removing the photo-resist film; sequentially forming a first insulation layer at a first predetermined temperature and a second insulation layer at second predetermined temperature over the surface of the substrate, said first predetermined deposition temperature is higher than said second predetermined temperature; coating a photo-resist film on the second insulation layer and patterning it to form a gate pattern; etching the first and second insulation layers using the gate pattern of the photo-resist pattern as a mask to expose the channel region; removing the gate pattern of the photo-resist film; forming a refractory metal over the surface of the first and second insulator layer and the exposed channel region; etching the refractory metal, thereby dividing it into two parts of which one is formed at the channel region and the other at the second insulation layer; selectively etching the first and second insulation layers to lift-off the refractory metal over the first and second insulation layers, thereby forming a gate of a T-shape at the channel region; coating a photo-resist film and patterning it to form a channel pattern of the photo-resist film; ion implanting Si into a substrate using the gate and the channel pattern of the photo-resist film to form a self-aligned high concentration ion implantation region; removing the channel pattern of the photo-resist film; forming a third insulation layer for preventing As of the substrate from evaporating over all the surfaces of the substrate; carrying out a rapid thermal annealing for activation; removing the third insulation layer; and forming an ohmic electrode using a lift-off process.

DETAILED DESCRIPTION OF THE INVENTION

Figure 1A:
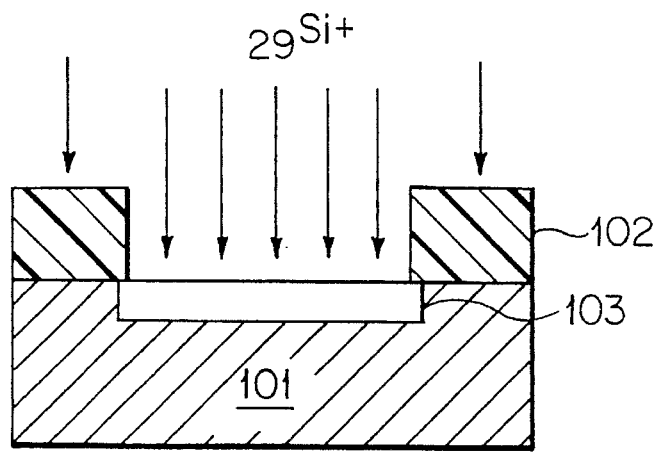
FIGS 1A through 1N are sectional views, illustrating a method for a self-aligned T-gate GaAs metal semiconductor field effect transistor, respectively.
Figure 1B:
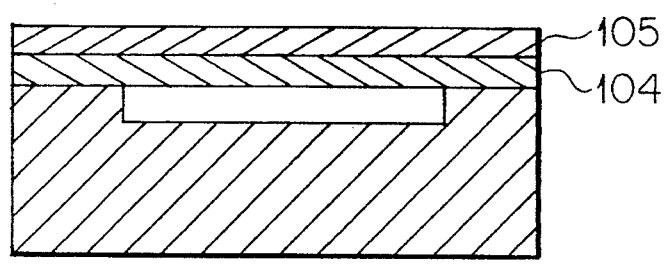
Figure 1C:
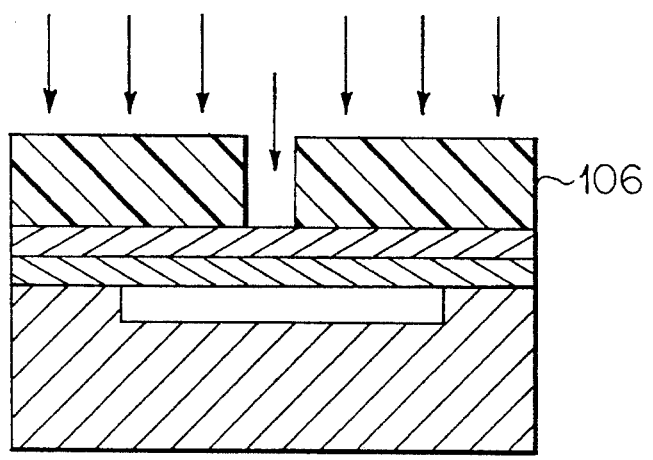
Figure 1D:
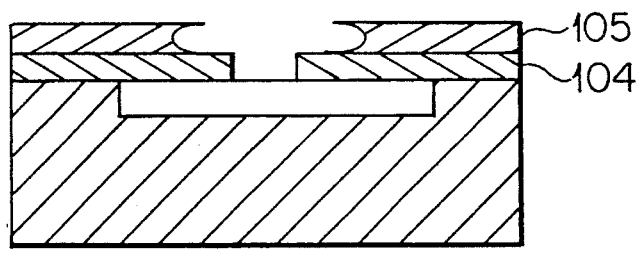
Figure 1E:
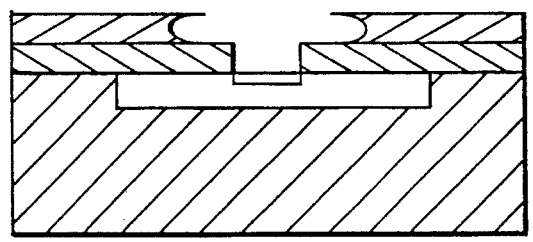
Figure 1F:
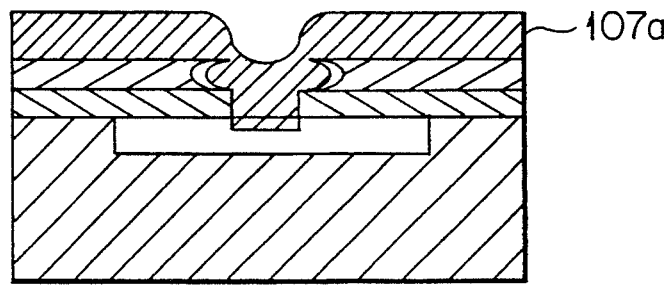
Figure 1G:
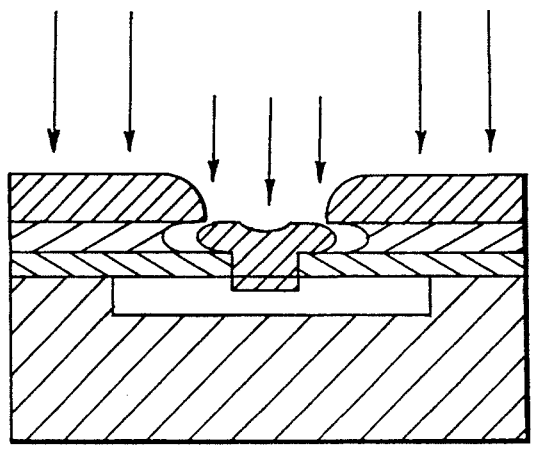
Figure 1H:
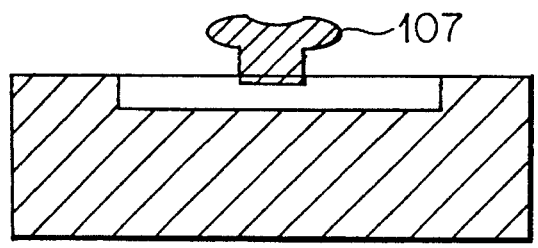
Figure 1I:
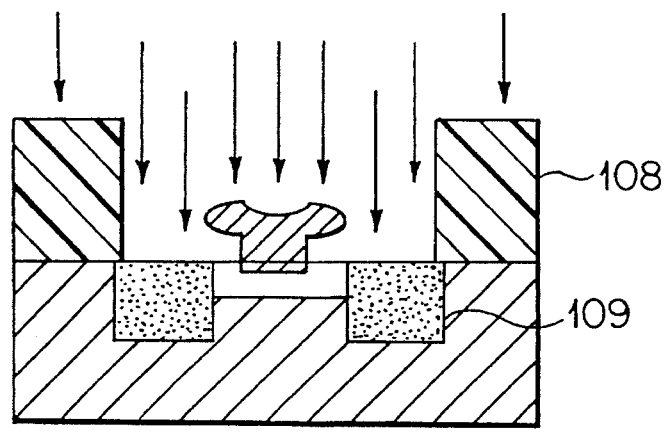
Figure 1J:
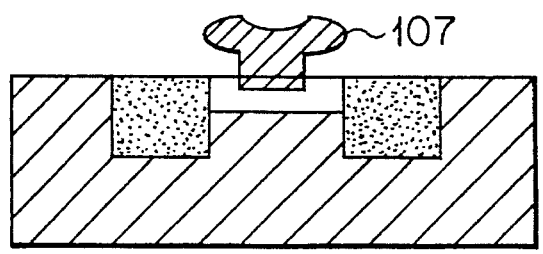
Figure 1K:
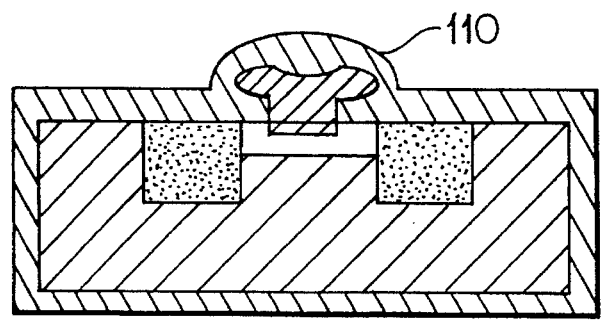
Figure 1L:
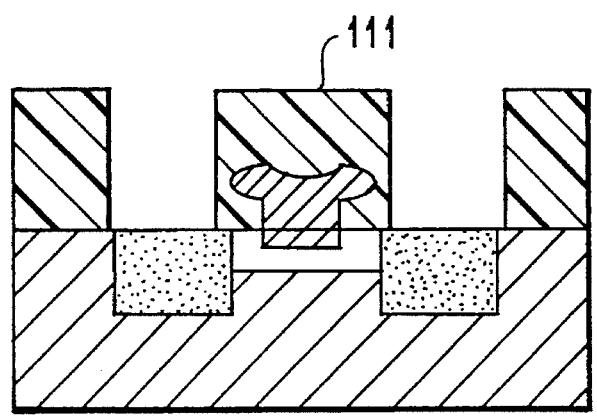
Figure 1M:
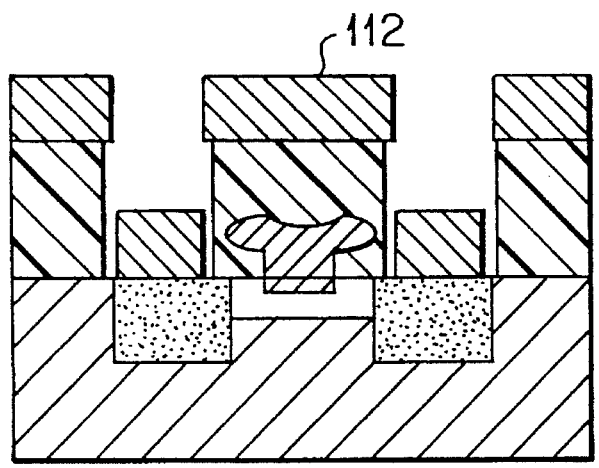
Figure 1N:
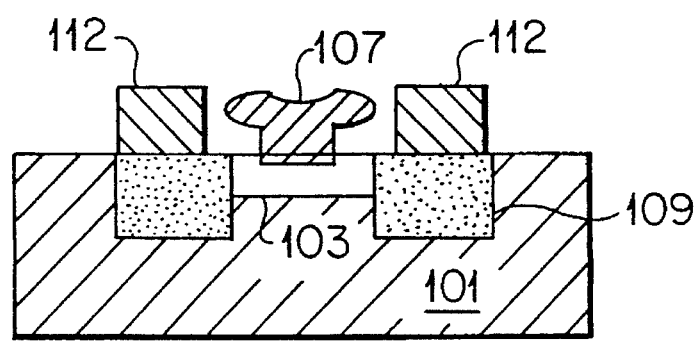

FIGS. 1A through 1N are sectional views, illustrating a method for a self-aligned T-gate GaAS metal semiconductor field effect transistor, respectively.

Referring to FIG. 1A, over the cleaned surface of a substrate 101 made of a semi-insulating GaAs, an N channel is defined with a photo-resist film 102 and $_{29}Si^+$ is ion implanted to form a channel 103. Then, the remnant photo-resist film 102 is removed.

Referring to FIG. 1B, over the whole surface of the substrate 101 at which the channel 103 is formed, a first insulation layer 104 made of a silicon nitride and a second insulation layer 105 made of a silicon dioxide are sequentially deposited using a plasma enhanced chemical vapor deposition (PECVD).

At this constant, the first insulation layer 104 is formed at the first predetermined temperature T1 of 300° to 350° C. and the second insulation layer 105 is formed at a second predetermined temperature T2 of 100° to 200° C. The thickness of each insulation layer may be preferably determined at a desired thickness under the consideration of the shape of a T-gate to be finally formed.

Referring to FIG. 1C, a photo-resist film 106 is coated over the second insulation layer 105 and then is developed to open a gate region. The second and first insulation layers 105 and 104 are sequentially etched with a reactive ion etching (RIE) method by use of the said developed pattern of the photo-resist film as a mask.

FIG. 1D shows a shape of the etched insulation layers 104 and 105, when the photo-resist film is removed after completion of a dry-etching method. As shown in FIG. 1D, because the second insulation layer 105 deposited at lower temperature T2 has an etching rate higher than the first insulation layer 104 deposited at higher temperature T1, when the first insulation layer 104 is etched after completion of etching of the second insulation layer 105, the side of the second insulation layer 105 under the gate pattern exposed by the photo-resist film 106, is over etched. As shown in drawing, the second insulation layer 105 has a shape that is wider than the first insulation layer 104.

Under this condition, referring to FIG. 1E, the channel 103 may be recess-etched.

Conventionally, the degree of a recess etch may be controlled, while a channel current is measured after formation of an ohmic electrode. However, in the present invention, after the desired degree of a recess etch has been done by a separate preceding step, a recess etch process is carried out under a condition such that an ohmic electrode is not formed.

Next, referring to FIG. 1F, over the upper surfaces of the etched double insulation layers 105 and 104, a refractory metal 107a for a gate metal is deposited with a sputtering method.

A tungsten silicide ($WSi_x$) or a tungsten nitride ($WN_x$) is preferably used as the material of the refractory metal 107a for a gate metal.

Referring to FIG. 1G, a gate portion is cut from the deposited refractory metal 107a for a gate with an RIE process.

Subsequently, referring to FIG. 1H, the first and second insulation layers 104 and 105 are selectively etched by dipping in HF, so that the refractory metal 107a over the insulation layers 104 and 105 is lifted-off and only the gate metal 107 of a T-shape is left.

Referring to FIG. 1I, a photo-resist film 108 is coated and then is developed to form a channel pattern. $_{28}S1^+$ is ion implanted into the substrate 101 to form a high concentration ion implantation region 109 for a self-aligned ohmic electrode by use of a T-gate metal 107 and the channel pattern of the photo-resist film as a mask.

At this constant, the space between the gate and the ohmic electrodes is determined by the shape of the gate metal 107.

FIG. 1J shows a sectional view when the photo-resist film 108 is removed after the ion implantation for forming ohmic electrodes.

Referring to FIG. 1K, in order to prevent As from evaporating from the substrate on annealing for electrical activation of the implanted S1 ions, a third insulation layer 110 made of a silicon nitride is deposited over all surfaces of the substrate 101 to a thickness of 800 Å and then is subjected to a rapid thermal annealing at a temperature in the range of 900° to 950° C. for approximately 10 seconds.

Referring to FIG. 1L, after completion of the rapid thermal annealing for activation, the third insulation layer 110 is removed. A photo-resist film is coated and then is developed to form an ohmic electrode pattern.

Referring to FIG. 1M, over the ohmic electrode pattern of the photo-resist film 111, a metal 112 for an ohmic electrode is deposited using a thermal evaporation method.

Referring to FIG. 1N, the ohmic electrode pattern of the photo-resist film is removed by dipping the substrate in acetone, thereby lifting-off the metal 112 over the photoresist pattern 111 to form ohmic electrodes.

As above described, the present invention can carry out a recess etching process differently from the prior SAG, thereby embodying the merit of SAINT as well as a process that is very simple as compared with the prior SAINT.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method for fabricating a metal semiconductor field effect transistor, comprising the steps of defining an N channel over a GaAs substrate with a photo-resist film and ion implanting Si to form the channel using the photo-resist film;

removing the photo-resist film;

sequentially forming a first insulation layer at a first temperature and a second insulation layer at a second temperature over the surface of the substrate, said first temperature being higher than said second temperature;

coating a photo-resist film on the second insulation layer and patterning it to form a gate pattern;

etching the first and second insulation layers using the gate pattern of the photo-resist pattern as a mask to expose the substrate;

removing the gate pattern of the photo-resist film;

forming a refractory metal over the surface of the first and second insulation layer and the exposed channel region;

etching the refractory metal, thereby dividing it into two parts, of which one is formed on the channel region and the other is formed on the second insulation layer;

selectively etching the first and second insulation layers to lift-off the refractory metal over the first and second insulation layers to lift-off the refractory metal over the first and second insulation layers, thereby forming a gate of a T-shape at the channel region;

coating a photo-resist film and patterning it to form a channel pattern of the photo-resist film;

ion implanting Si into the substrate using the gate and the channel pattern of the photo-resist film to form a self-aligned high concentration ion implantation region;

removing the channel pattern of the photo-resist film;

forming a third insulation layer for preventing As of the substrate from evaporating over all the surfaces of the substrate;

carrying out a rapid thermal annealing for activation;

removing the third insulation layer; and forming an ohmic electrode using a lift-off process.

2. The method as claimed in claim 1, wherein the first temperature T1 is in the range of 300° to 350° C. and the second temperature T2 is in the range of 100° to 200° C.

3. The method as claimed in claim 2, further comprising a step for recess-etching the channel after the etching step of the first and second insulation layer.

4. The method as claimed in claim 1, wherein the refractory metal contains tungsten silicide or tungsten nitride.

5. The method as claimed in claim 1, wherein the rapid thermal annealing is carried out at a temperature in the range of 900° C. to 950° C. for approximately 10 seconds.

* * * * *